United States Patent
Schaller et al.

(10) Patent No.: US 7,098,140 B2
(45) Date of Patent: Aug. 29, 2006

(54) METHOD OF COMPENSATING FOR ETCH RATE NON-UNIFORMITIES BY ION IMPLANTATION

(75) Inventors: Matthias Schaller, Dresden (DE); Christoph Schwan, Gebhardshain (DE); Carsten Hartig, Meerane (DE)

(73) Assignee: Advanced Micro Devices, Inc., Austin, TX (US)

( * ) Notice: Subject to any disclaimer, the term of this patent is extended or adjusted under 35 U.S.C. 154(b) by 282 days.

(21) Appl. No.: 10/761,576

(22) Filed: Jan. 21, 2004

(65) Prior Publication Data

US 2004/0266200 A1    Dec. 30, 2004

(30) Foreign Application Priority Data

Jun. 30, 2003 (DE) .................. 103 29 389

(51) Int. Cl.
*H01L 21/461* (2006.01)
*H01L 21/302* (2006.01)

(52) U.S. Cl. ...................... 438/706; 438/714
(58) Field of Classification Search .............. None
See application file for complete search history.

(56) References Cited

U.S. PATENT DOCUMENTS 3,808,068 A * 4/1974 Johnson et al. ............ 216/87
4,438,556 A * 3/1984 Komatsu et al. ........... 438/532
2002/0093071 A1* 7/2002 Chheda et al. ............. 257/510
2003/0097198 A1 5/2003 Sonderman et al. ........ 700/110

FOREIGN PATENT DOCUMENTS

| EP | 0 148 448 A2 | 7/1985 |
|---|---|---|
| JP | 03297137 A | 12/1991 |
| JP | 04333236 A | 11/1992 |
| JP | 2000021999 A | 1/2000 |
| JP | 2000188396 A | 7/2000 |

* cited by examiner

*Primary Examiner*—Duy-Vu N Deo
(74) *Attorney, Agent, or Firm*—Williams, Morgan & Amerson

(57) ABSTRACT

Etch uniformity is improved in that a specified material layer to be etched is exposed to an ion beam so as to implant an ion species, wherein at least one implantation parameter is varied in conformity with local etch rates of the specified material layer. In this way, etch non-uniformities, induced by tool non-uniformities and recipe specific characteristics, may be significantly reduced.

31 Claims, 2 Drawing Sheets

METHOD OF COMPENSATING FOR ETCH RATE NON-UNIFORMITIES BY ION IMPLANTATION

BACKGROUND OF THE INVENTION

1. Field of the Invention

Generally, the present invention relates to the field of fabricating microstructures such as integrated circuits, micromechanical structures and the like, and, more particularly, to the formation of structural elements by removing material in an etch tool.

2. Description of the Related Art

Presently, microstructures are integrated into a wide variety of products. One example in this respect is the employment of integrated circuits that, due to their relatively low cost and high performance, are increasingly used in many types of devices, thereby allowing superior control and operation of those devices. Due to economic reasons, manufacturers of microstructures, such as integrated circuits, are confronted with the task of steadily improving performance of these microstructures and/or reducing production costs with every new device generation appearing on the market. Manufacturing of microstructures is typically accomplished by producing a large number of substantially identical devices on a single substrate, wherein many manufacturing steps, such as depositing material layers and patterning material layers by etching, are performed simultaneously for all devices on the substrate. Thus, there is an ongoing drive in this field of industry to steadily increase the substrate size so as to place as many devices as possible on a single substrate, thereby increasing production yield.

On the other hand, an increasing substrate size may entail a plurality of issues in terms of substrate handling and process uniformity across the entire substrate area. The problem of process non-uniformities is even exacerbated as the critical dimensions of structural elements are reduced, since corresponding process tolerances, i.e., maximal allowable deviations from a design value, are also usually reduced, requiring an advanced process control.

One important process sequence in forming microstructures, such as sophisticated integrated circuits, is the transfer of a pattern provided in a mask layer into a material layer located underneath the mask layer by etching exposed portions of the lower material layer while substantially maintaining portions covered by the mask layer. Thus, a high degree of anisotropy in the material removal is necessary to obtain the required pattern with a minimum of under-etching. Etch processes of this type are configured as so-called dry etch processes performed in a gaseous atmosphere creating an anisotropic particle bombardment. In contrast, wet etch processes typically exhibit a substantially identical etch rate in all directions, i.e., an isotropic process, and therefore do not allow the formation of structural elements with lateral dimensions in a material layer having a thickness on the order of the lateral dimensions of the elements. The etch rate is herein defined as the thickness decrease of a specified material layer per time unit. For example, the etch rate may be expressed by nanometer per minute, or the like. Ideally, an etch process exhibits high selectivity to the material of the mask layer, frequently provided as a photoresist layer, and also to the material lying under the material to be removed. Moreover, a moderately high etch rate in the vertical direction and a negligible etch rate in the horizontal direction is preferred, unless a certain under-etching or an isotropic etching behavior is desired.

A large number of etch tools have been developed that more or less comply with the above-identified requirements. As the dimensions of the substrates are increasing, it becomes increasingly difficult to maintain process uniformity, i.e., a substantially constant etch rate, within the entire process chamber. In particular, it turns out that it is extremely difficult to establish substantially constant conditions over a distance of approximately some several hundred millimeters so that for substrate sizes of modern integrated circuits, i.e., 200 mm or even 300 mm, the etch tools are designed so as to process single substrates sequentially. Presently, a plurality of tool configurations are used to anisotropically or isotropically etch wafers. For instance, single wafer parallel plate reactors have a relatively simple configuration, in which the substrate is placed on one of two parallel electrodes so as to establish a plasma atmosphere over the substrate surface. Obtaining an appropriate etch rate uniformity across the entire substrate surface, however, requires an optimum gas distribution provided by a so-called shower head, which is difficult to achieve for substrates having a large diameter.

A further type of dry etching tool is a so-called magnetic-enhanced reactive ion etcher, in which the magnetron principle from sputter deposition tools is used to enhance the excitation process for primary electrons at lower gas pressures. Another type of etch tool is represented by downstream etchers, in which the reactive species are created in a plasma remote from the actual process chamber and are then transported to the process chamber. Since these etch tools lack the directionality of charged particles being directed to the substrate surface, the corresponding etch behavior is isotropical. Yet another tool configuration allowing good line width control, selectivity and low particle bombardment-induced damage is based on electrode-less, low pressure, high density plasma sources.

Despite the many successes achieved in the development of modern etch tools, it appears, nevertheless, that etch rate non-uniformities may occur in the range of several percent, depending on the specific etch tool and etch recipe used. In some applications, the etch rate non-uniformity may have a significant influence on the performance of the completed devices. For instance, modern integrated circuits formed in conformity with sophisticated CMOS technologies require extremely thin gate insulation layers to allow the fabrication of field effect transistors having a gate length in the deep sub-micron range. As a consequence, the patterning of an overlying gate electrode, typically provided as a doped polysilicon layer, necessitates a highly anisotropic accurate etch process that can be reliably stopped at the gate insulation layer without unduly damaging this layer. A non-uniformity of the etch rate may lead to a corresponding non-uniformity of the gate insulation layers, and, thus, of transistor performance of devices located at different areas of the substrate. A further example, in view of a minimal etch non-uniformity, is the formation of vias and trenches in a low-k dielectric, which is increasingly used in forming copper-based metallization layers.

In some approaches for forming these metallization layers, the vias are formed first and, subsequently, the trenches are etched without employing an etch stop layer so as to not unduly compromise the total permittivity of the low-k dielectric. Since the finally obtained depth of the trenches is merely controlled by the etch time, a corresponding non-uniformity of the etch rate may lead to a corresponding variation of the trench depth and may thus result in a significant conductivity variation after the trenches are filled with copper.

In view of the problems identified above, there exists a need for an improved technique that may provide increased etch rate uniformity in modern etch tools. The present invention is directed to various methods and systems that may solve, or at least reduce, some or all of the aforementioned problems.

SUMMARY OF THE INVENTION

Generally, the present invention is directed to various methods and a process tool system in which etch rate non-uniformity of a specified etch tool may be compensated for, or at least significantly reduced, by implanting a specified ion species into a material layer to be etched, while locally varying at least one implantation parameter value, such as the dosage of implanted ions in conformity with the local etch rate variation. The present invention takes advantage of the fact that the implantation of ions into a material layer may significantly change the etch rate of the material when exposed to a specific reactive etch ambient.

According to one illustrative embodiment of the present invention, the method comprises determining, for a specified etch tool and a specified etch recipe, across-substrate, that is local, variations in etch rate when performing the etch recipe in the etch tool. A process layer is formed above a substrate. Additionally, an ion implantation process is performed to implant ions into the process layer formed above the substrate, wherein at least one parameter of the ion implantation process is determined based upon the determined across-substrate variations in etch rate. Finally, the etch recipe is performed on the process layer formed above the substrate after the ion implantation process is performed.

According to another illustrative embodiment of the present invention, the method comprises determining, for a specified etch tool and a specified etch recipe, across-substrate variations in etch rate when performing the etch recipe in the etch tool. Based upon the across-substrate variations in etch rate, at least one parameter of an ion implant process to be performed on a process layer to be subjected to the etch recipe in the etch tool is determined. Moreover, the ion implant process comprised of the determined parameter is performed on the process layer.

According to still another illustrative embodiment of the present invention, the method comprises determining, for a specified etch tool and a specified etch recipe, across-substrate variations in etch rate when performing the etch recipe in the etch tool. Moreover, based upon the determined across-substrate variations in etch rate, at least one parameter of an ion implant process is determined that produces across-substrate variations in implant regions formed by performing the implant process. Finally, the ion implant process is performed on at least one process layer to be subjected to the etch recipe in the etch tool.

According to a further illustrative embodiment of the present invention, an ion implantation is carried out that is compatible with preceding and subsequent manufacturing processes, wherein a correlation between etch rate non-uniformities of a subsequent etch process and at least one implantation parameter value, for instance the dosage, is established and the implantation process is controlled on the basis of this correlation.

According to still a further illustrative embodiment of the present invention, the method comprises determining, for a specified etch tool and a specified etch recipe, a local etch rate at a plurality of locations on a first substrate, wherein the etch recipe is designed to remove a layer of a specified material formed on the first substrate. Then, ions are implanted into a layer of the specified material that is formed on a second substrate prior to subjecting the second substrate to an etch process with the specified etch recipe in the specified etch tool, wherein one or more implantation parameters are adjusted on the basis of the local etch rate obtained from the first substrate.

According to still another illustrative embodiment of the present invention, the method comprises forming a first layer of a specified material on a first substrate and etching the first layer while using a specified etch tool and a specified etch recipe. Next, a second layer of the specified material is formed on a second substrate and/or the first substrate and a specified ion species is implanted into the second layer according to specified implantation parameters. Thereafter, the second layer is etched using the specified etch tool and the specified etch recipe and a difference is determined between a first etch rate in etching the first layer and a second etch rate in etching the second layer at a predefined location on the first and the second substrate.

Pursuant to yet another illustrative embodiment of the present invention, an advanced process system comprises an etch tool configured to be operated according to a specified process recipe. Moreover, the system comprises an etch rate measurement device that is configured to determine a local etch rate at a plurality of different locations on a substrate. The system further comprises an implantation tool and a control unit which is operatively connected to the etch rate measurement device and the implantation tool. The control unit is configured to obtain the local etch rates and to control at least one implantation parameter of the implantation tool on the basis of the local etch rates.

BRIEF DESCRIPTION OF THE DRAWINGS

The invention may be understood by reference to the following description taken in conjunction with the accompanying drawings, in which like reference numerals identify like elements, and in which.

Figure 1:
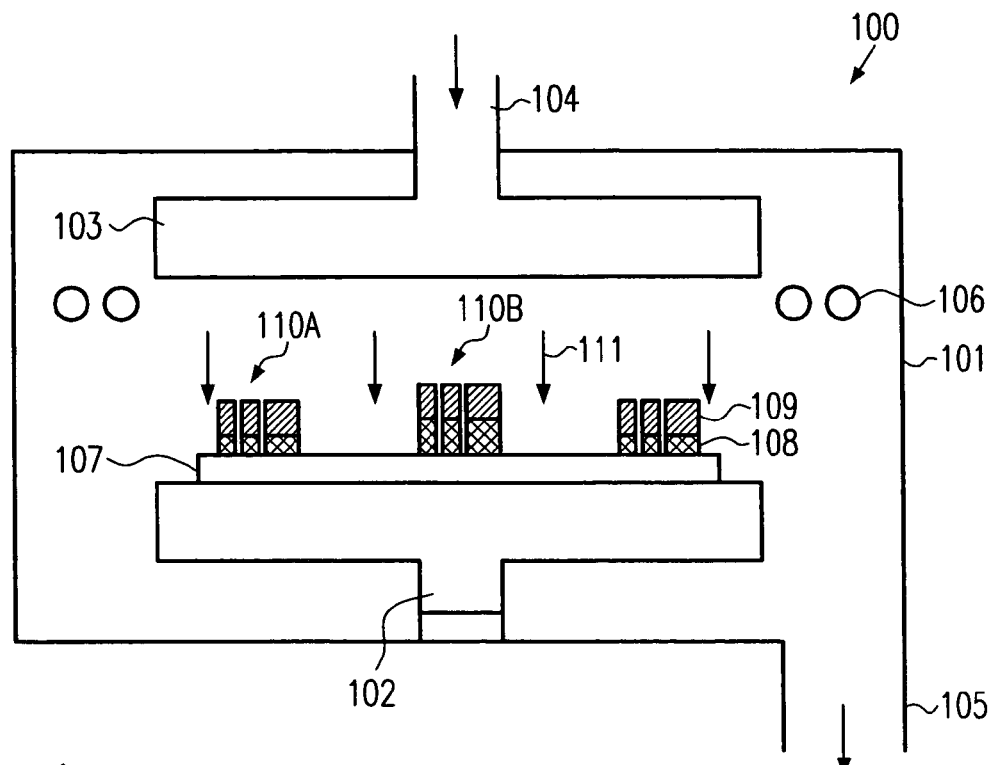
FIG. 1 schematically shows an etch tool generating a certain etch rate non-uniformity across a single substrate.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

It is known that the introduction of dopants into a material layer may significantly change the behavior of the layer during an etch process. It is believed that damage in the crystalline structure or a change in the near range order of substantially amorphous material layers may lead to a different etch rate compared to the non-doped material layer. This effect is taken advantage of by the present invention to modify an etch rate created in a specified etch tool when operated in conformity with a specified etch recipe.

With reference to FIG. 1, a representative etch process will now be described in more detail. An etch tool 100, which may be of any type as previously described or which may have any appropriate etch tool configuration of current and future devices, comprises a process chamber 101 having an input 104 for feeding reactive gases and carrier gases, and having an output 105 connected to an appropriate means (not shown) for establishing and maintaining a specified pressure within the process chamber 101. The input 104 may be connected to a means for uniformly distributing the reactive gases, such as a shower head 103. A substrate holder 102 is provided in an appropriate geometrical arrangement with respect to plasma excitation means 106 and the shower head 103. Moreover, the plasma excitation means 106, e.g., a coil, is provided so as to couple high frequency energy into the process chamber 101 to establish a plasma atmosphere. It should be noted that the provision of the shower head 103 and of the plasma excitation means 106 is of an illustrative nature only. The considerations pointed out below will apply to any modern single substrate etch tool currently available. However, it should be understood that the present invention may be employed in any type of etch tool that may be used in performing etching processes in semiconductor manufacturing operations.

During the operation of the etch tool 100 in accordance with a specified etch recipe, i.e., with corresponding sets of process parameters, such as the type of reactive gases, density of ionized particles created by the plasma excitation means 106, bias voltage generated between the plasma atmosphere and the substrate holder 102, gas pressure within the process chamber 101, etch time and the like, a substrate 107 may be placed on the substrate holder 102 with a layer 108 formed thereon that is to be patterned by means of a mask layer 109, which may be comprised of, for example, a photoresist. It should be noted that the provision of the patterned mask layer 109 is illustrative only, since the transfer of a specified pattern into the underlying material layer 108 is a typical process sequence in the formation of integrated circuits. The present invention, however, is not limited to etch processes for generating patterned structures and may as well be applied to a uniform material removal so as to, for example, reduce a thickness of a specified material layer. In this case, the mask layer 109 may be omitted.

During the etch process, the impact of the reactive species, indicated by arrows 111, on exposed portions of the layer 108 will result in a material removal, thereby increasingly transferring the pattern of the mask layer 109 into the underlying material layer 108. For instance, as previously explained, the material layer 108 may represent a low-k dielectric layer during the formation of trenches, wherein, in some etch schemes, the end of the etch process and, thus, the finally obtained depth of the trenches is merely defined by the etch rate, that is, by the etch time. An example for a non-patterned material layer 108 may be the removal of the layer 108 when this layer has been deposited as a sacrificial layer for a certain purpose. In other cases, the thickness of the layer 108 has to be reduced to a specified value as uniformly as possible. The material layer 108 may also be, for example, a layer of polysilicon where gate electrode features may be formed by the etching process. Thus, the present invention should not be considered as limited to the formation of any particular types of features, or patterns, or to the types of material comprising the material layer 108, unless such limitations are expressly recited in the appended claims.

Owing to tool specifics, such as the configuration of the shower head 103, the plasma excitation means 106, the distance of the shower head 103 and the substrate holder 102, and of the process recipe used, different etch rates may occur at different locations across the surface of the substrate 107. For instance, as shown in FIG. 1, the etch rate at a location 110A at the periphery of the substrate 107 may be less than an etch rate at a central location 110B, so that corresponding trenches may exhibit a greater depth at the center 110B as compared to the periphery 110A. It will be appreciated that the etch rate non-uniformity may take on any other distribution across the total surface area of the substrate 107 and may typically vary depending on the specific etch tool 100 and the specified etch recipe used. The variations in etch rate may be very localized in nature.

Usually, the etch tool 100 is equipped with a measuring device (not shown) that allows the determination of an end point of the etch process by, for example, analyzing the spectroscopic data received from by-products released during the etch process. Thus, when the corresponding measurement device indicates the end of the etch process, possibly including a certain over-etch time, a thickness variation of the material layer 108 or a variation of the pattern formed in the material layer 108 may occur with respect to the locations 110A and 110B. In some embodiments of the present invention, an optical measurement device such as an ellipsometer (not shown) may be provided that is configured to determine a thickness of the material layer 108 during various phases of the etch process. By comparing corresponding layer thicknesses at the locations 110A and 110B, in view of the elapsed etch time, respective etch rates during the various phases of the etch process may then be determined.

Figure 2:
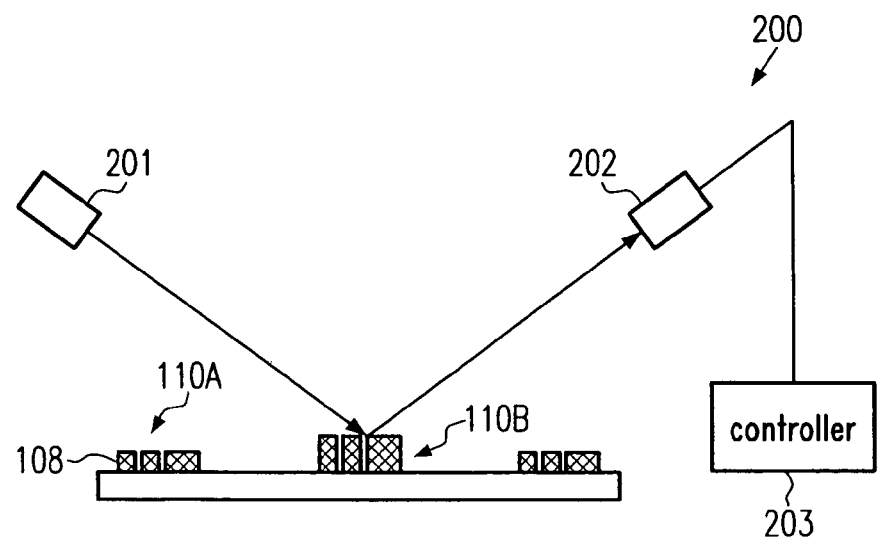
FIG. 2 schematically depicts a layer thickness measurement device that enables the determination of a local etch rate in accordance with illustrative embodiments of the present invention.

FIG. 2 schematically shows a measurement device 200 in accordance with another embodiment of the present invention, wherein one or more characteristics of the material layer 108 may be determined after the etch process is completed. In some embodiments, the measurement device 200 may represent a layer thickness measurement device that is adapted to obtain a layer thickness at various locations of a substrate, e.g., an ellipsometer metrology tool. In other embodiments, the measurement device 200 may comprise a radiation transmitter 201, a radiation detector 202 and a controller 203 connected to the receiver 202. The transmitter 201 may be configured to emit a beam of radiation, for instance a light beam of one or more appropriate wavelengths, to a specified location, such as the locations 110A, 110B of the substrate 107, wherein the receiver 202 detects reflected and/or scattered radiation and provides a respective signal to the controller 203. From the characteristics of the reflected and/or scattered radiation beam, the controller 203 may then deduce properties of the patterned layer 108, which are related to the local etch rate at the corresponding location of the substrate 107. For example, the depth of trenches and/or angles of sidewalls, and the like may be determined by the controller 203 and may be related to the corresponding local etch rate. In one embodiment, the pattern formed in the layer 108 substantially represents the pattern of a product substrate so that the influence of the type of pattern to be produced is also taken into consideration when determining an "effective" local etch rate. In other embodiments, the local etch rates for the specified material of the layer 108 may be determined on the basis of a non-patterned etch procedure. In some illustrative embodiments, a plurality of etch rate measurements may be performed across the entire substrate 107, or a specified portion thereof, so as to produce a "non-uniformity map" of the specific etch tool 100 and the specified etch recipe.

The variation of the local etch rates determined by the measurement device 200 may be compensated for or at least reduced in subsequent substrates to be processed in the etch tool 100 with the specified etch recipe, in that a correspondingly adapted ion implantation is performed so as to non-uniformly implant a specified ion species into the material layer 108 prior to etching the layer 108.

Figure 3:
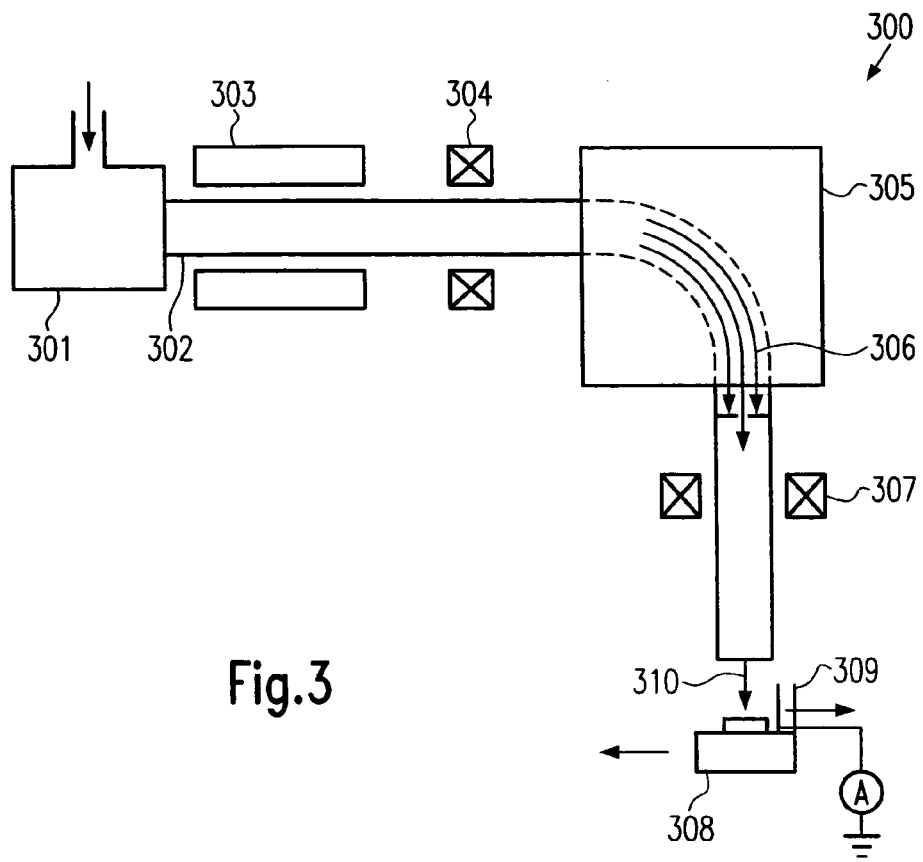
FIG. 3 schematically illustrates an ion implantation tool as it may be used according to the present invention.

FIG. 3 schematically represents a typical ion implantation tool 300 as may be used in accordance with the present invention. The ion implantation tool 300 comprises an ion source 301 connected to a beam line 302. An acceleration stage 303 is configured to accelerate the ionized particles up to a specified energy. Beam-shaping quadrupole magnets 304 and 307 are arranged around the beam line 302, wherein a deflecting magnet 305 is interposed therebetween. An analyzing slit 306 is provided so that particles of a specified species and having an energy within an allowable small range can pass through the analyzing slit 306. A substrate holder 308 is located at the end of the beam line 302 and is typically configured to be movable in at least one transverse direction. The movable substrate holder 308 may comprise a Faraday cup 309 that allows monitoring of the beam current.

During the operation of the implantation tool 300, a substrate, such as the substrate 107, having formed thereon the material layer 108, is mounted on the substrate holder 308 and is exposed to an ion beam 310 having an energy and a dosage as defined by the parameter setting of the ion implantation tool 300. It is to be noted that in conventional ion implantation processes, the energy of the ion beam 310, its dosage and the respective implantation time is selected so as to obtain a required dopant profile as uniformly across the substrate 107 as possible. Typically, the lateral dimensions of the ion beam 310 are significantly less than the size of the substrate 107 and, thus, either the ion beam 310, the substrate 107, or both, are correspondingly moved to scan the entire surface of the substrate 107, wherein the scanning movement is controlled so as to obtain a substantially uniform dosage across the entire area of the substrate 107. Contrary thereto, according to the present invention, one or more process parameters of the implantation tool 300 are controlled on the basis of the local etch rates obtained, for example, by means of the measurement device 200 in FIG. 2.

In one particular embodiment, the movement of the substrate holder 308 may be controlled so as to adapt the local implantation dosage to the local etch rate, for example, corresponding to the locations 110A and 110B. If, for example, ion implantation with a specified parameter setting increases the etch rate of the specified material layer 108, the substrate holder 308 may be controlled so as to provide an increased dosage at the peripheral regions 110A so as to increase the corresponding local etch rate in a subsequent etch process in the tool 100 according to the specified etch recipe, thereby compensating for, or at least reducing etch rate non-uniformities and, thus, thickness non-uniformities and/or structural non-uniformities. In other embodiments, the operation of the deflection magnet 305 and/or of the beam-shaping quadrupole magnets 304 and 307 may be controlled, additionally or alternatively, to the control of the wafer holder 308 so as to obtain a required non-uniform implantation dosage in accordance with local etch rates.

The ionic species implanted into the material layer 108, prior to etching this layer, may be selected on the basis of process requirements in manufacturing the devices on the substrate 107 and on the basis of the magnitude of influence the ionic species exerts on the specified material layer 108 upon etching this layer with the tool 100 and the specified etch recipe. For instance, if it is required that a change of electrical properties of the material layer 108 after etching the same is substantially not acceptable, a substantially inert ion species, such as ions of noble gases, may be selected. In other cases, ions of the same type as initially contained in the material layer 108 may be implanted, so that electrical characteristics thereof are substantially maintained after implantation. In yet another case, the ion species is selected so as to have a diffusivity that is less than a predefined threshold at temperatures of subsequent manufacturing processes. Once an acceptable ion species is selected, an appropriate energy for positioning the ions within the layer 108 may be obtained by simulation calculations and/or by experiment. In one embodiment, an energy of the ion species that is to be non-uniformly implanted into the material layer 108 is controlled such that the ion species is substantially confined within the layer 108 substantially without penetrating any areas lying underneath the layer 108.

If the type of ion species to be implanted is not critical for further manufacturing processes, the type of ion species may be selected by taking into consideration merely their influence on the etch process so as to obtain an efficient etch rate modification by a moderate variation of the implantation dosage. A corresponding categorization of ion species may be obtained by experiment, as will be discussed later on.

After generating the required non-uniformity implantation within the material layer 108, the substrate is etched in the etch tool 100, according to the specified etch recipe as is described with reference to FIG. 1. It may be advantageous that a plurality of substrates 107 may receive substantially the same implantation dosage and may then be processed by the etch tool 100 according to the specified process recipe. In one embodiment, the local etch rates of one or more of the plurality of the substrates 107 may then be determined so as to verify the correctness of the currently used parameter setting of the ion implantation tool 300. For instance, the plurality of substrates 107 may be measured and the corresponding measurement results, i.e., the corresponding etch rates, may be averaged to obtain a representative set of local etch rates on the basis of which the parameter setting of the ion implantation tool 300 may be readjusted so as to enhance the compensation or reduction of non-uniformities in the etch process and/or to continuously adapt the parameters of the ion implantation tool 300 to a change of the etch process over time.

In one particular embodiment, a correlation between an etch rate modification effected by a specific parameter setting of the ion implantation tool and a specified material or a plurality of materials that are to be etched in one or more specific etch tools in accordance with one or more specified etch recipes may be established in the following way.

First, a plurality of substrates, such as the substrate 107, including the specified material layer 108 may be prepared and may be subjected to an ion implantation, wherein for each substrate 107 one parameter value of a specified implantation parameter is selected differently. For instance, the ion species, the vertical dopant profile within the layer 108, the dosage, the energy, an implantation tilt angle, and the like, may be varied. Thereafter, the plurality of substrates 107 is processed in a specified etch tool, such as the tool 100, with a specified etch recipe. In other embodiments, two or more different etch tools may be used with respect to specific etch recipes in order to obtain information on a plurality of etch tools and etch recipes. To this end, a sufficient amount of substrates 107 are prepared, wherein the plurality of substrates 107 are grouped into sets, each set having experienced substantially the same ion implantation parameter setting. Each member of a corresponding set may then be processed with a specific etch tool and a specific etch recipe. In other embodiments, the plurality of substrates 107 may not necessarily be prepared simultaneously. Instead, one or more substrates 107 may be reworked after ion implantation and etching the substrate and a new material layer 108 is formed and is exposed to the ion beam having a differently selected parameter value. Thus, after etching the substrate 107, corresponding local etch rates may be determined, for example by a measurement device as shown in FIG. 2, and may be correlated to a corresponding parameter value of the ion implantation parameter under consideration. For example, when the type of ion species represents the ion implantation parameter to be varied, the dependency of the etch rate may be correlated to the type of ions implanted into the layer 108. In a similar fashion, the relationship between an etch rate of the layer 108 and any corresponding implantation parameter may be obtained. In this way, for example, the influence of a varying dosage on the etch rate may be determined, as some materials may exhibit different behavior for low and high dosages. In other cases, the influence of the location of the peak concentration, which is substantially determined by the ion energy and the type of ions used, may be correlated to the etch behavior. A corresponding correlation may be important in compensating or reducing etch non-uniformities of a thick layer 108, when a dopant concentration within the layer thickness may significantly vary. In other embodiments, two or more implantation parameters may be varied simultaneously for each of the plurality of substrates 107, when it is assumed that a synergetic effect may occur that significantly exceeds the effect that is obtained by individually varying the two or more parameters. It should be noted that the etch rate for each of the substrates 107 may be determined on a predefined location so that a corresponding non-uniformity of the etch process under consideration may be considered negligible. In other cases, a plurality of predefined locations may be employed for determining local etch rates and these etch rates may be averaged for each of the predefined locations so as to obtain a single global etch rate for each of the substrates 107.

Similarly, the etch rate for the undoped layer 108 is determined. From these measurement values, a corresponding correlation may be established that relates the one or more specific implantation parameters to the global etch rate for the specified material layer 108 when processed in a specific etch tool in compliance with a specified etch recipe. As previously explained, a corresponding correlation may be established for a plurality of different material layers 108, a plurality of different etch tools and a plurality of different etch recipes. Then, a specific non-uniformity of the etch process under consideration is determined by measuring local etch rates at predefined substrate locations. It should be noted that these local etch rates may also be determined simultaneously with determining the global etch rate, when the determination of the global etch rate is based on measurements of plural predefined substrate locations. Once a corresponding non-uniformity map is established, an appropriate ion species may be selected from the above obtained measurement results and one or more implantation parameters may be selected that shall be used for compensating or reducing the etch non-uniformities. In those cases, when the established correlation does not include measurement values relating to the actually determined etch non-uniformity, a corresponding intermediate value may be obtained by interpolation, fitting and other data manipulations as are well known in the art.

The non-uniformity map and corresponding values for the one or more implantation parameter values required to substantially compensate for the non-uniformities may then be used to control the ion implantation by, for example, correspondingly driving the ion beam scanning, as is explained with reference to FIG. 3. After processing one or more product substrates in accordance with the above established correlations, the etch rate non-uniformity, i.e., the non-uniformity map, for the one or more product substrates may be established and may be used to update or refine the previously used parameter values so as to enhance the accuracy of the process and/or to take account of subtle tool variations occurring during the operation of a corresponding etch tool while processing a large number of substrates.

Figure 4:
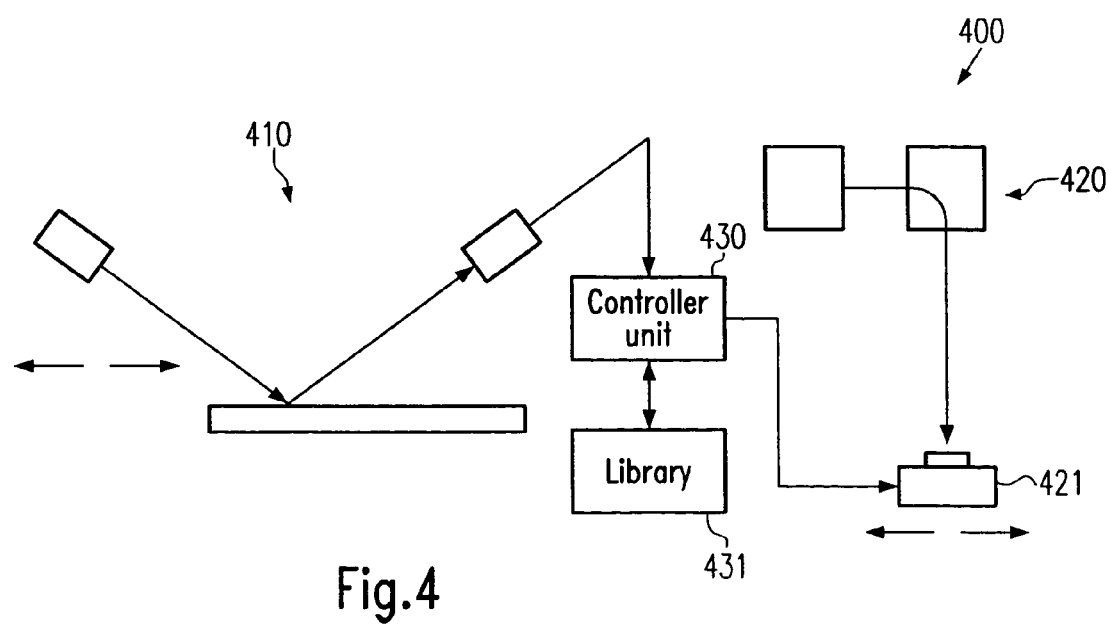
FIG. 4 schematically illustrates an advanced process system including a measurement device for determining a local etch rate, an ion implantation tool and a control unit operatively connected thereto so as to control an implantation parameter on the basis of the local etch rate in accordance with illustrative embodiments of the present invention.

FIG. 4 schematically shows an advanced process system 400 in accordance with one particular embodiment of the present invention. The system 400 comprises a measurement device 410 configured to establish a non-uniformity map of a substrate that has been etched with a specified etch tool according to a specified etch recipe. For instance, the measurement device 410 may be constructed and may be operated in a similar fashion as explained with reference to FIG. 2. In one illustrative embodiment, the measurement device 410 may be a scatterometry tool. The system 400 further comprises an ion implantation tool 420 having at least one means that enables the variation of at least one implantation parameter during the processing of a substrate. For instance, a movable substrate holder 421 may be provided that allows control of the dosage to which specified portions of a substrate are exposed. It should be appreciated that additionally or alternatively other tool parameters, such as implantation energy, beam shape, and the like, may be varied during the processing of a substrate so as to enable the local modification of the implantation. Moreover, a control unit 430 is provided and is operatively connected to the measurement device 410 and to the implantation tool 420. In one embodiment, the control unit 430 may comprise or may be connected to a library 431 containing at least one correlation between at least one ion implantation parameter and an etch non-uniformity map obtained by the specific etch tool when operated with the specific etch recipe.

During operation, the system 400 receives measurement results of one or more substrates processed by the measurement device 410, having formed thereon a specified material layer that has previously been etched by the specific etch tool with the specified etch recipe. The measurement results may be received by the control unit 430 and may accordingly be processed, for instance, may be compared with the correlation stored in the library 431, so as to assign an appropriate implantation parameter value to a specified substrate location. The control unit 430 may further be configured so as to provide a control signal to the ion implantation tool 420, for example to the movable substrate holder 421, so as to modify the implantation process in accordance with the control signal supplied by the control unit 430. For instance, the relevant parameter may be the dosage of a specified ion species and the movement of the substrate holder 421 may be controlled by the control unit 430 in a manner that the dosage-induced etch rate modification substantially reduces or even compensates for the etch non-uniformities, as determined by the measurement device 410, of a previously etched substrate. Thus, the system 400 enables control of the ion implantation tool 420 on the basis of non-uniformity measurement results in a substantially automated manner.

As a result, the present invention provides a technique that advantageously uses the possibility of locally varying an ion implantation process and combines this attribute with the fact that ion implantation may have a significant effect on the etch rate of a specified material. Consequently, process uniformity of present and future etch tools may significantly be improved, thereby allowing the formation of extremely scaled microstructures and/or improving production yield.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

The invention claimed is:

1. A method, comprising:
  determining, for a specified etch tool and a specified etch recipe, across-substrate variations in etch rate when performing said etch recipe in said etch tool;
  forming a process layer above a substrate;
  performing an ion implantation process to implant ions into said process layer formed above said substrate, wherein at least one parameter of said ion implantation process is determined based upon said determined across-substrate variations in etch rate; and
  performing said etch recipe on said process layer formed above said substrate after said ion implantation process is performed.

2. The method of claim 1, further comprising performing said ion implantation process comprised of said determined at least one parameter on a process layer formed above at least one subsequently processed substrate prior to performing said etching recipe on said process layer formed above said at least one subsequently processed substrate.

3. The method of claim 1, wherein said etch rate is determined based upon measurements made as said etching process is being performed.

4. The method of claim 1, wherein said etch rate is determined based upon measurements made after said etching process has been completed.

5. The method of claim 1, further comprising establishing a relationship between said at least one implantation parameter and an etch rate for said process layer and said specified etch recipe.

6. The method of claim 5, wherein an implantation dose is varied so as to substantially compensate for said substrate-across etch rate non-uniformities on the basis of said relationship.

7. The method of claim 1, wherein an implantation energy is selected so that a peak concentration of implanted ions is within a thickness of said process layer.

8. The method of claim 1, wherein said ions are selected so as to have a diffusivity that is less than a predefined threshold at temperatures of subsequent manufacturing processes.

9. A method, comprising:
  determining, for a specified etch tool and a specified etch recipe, across-substrate variations in etch rate when performing said etch recipe in said etch tool;
  determining, based upon said across-substrate variations in etch rate, at least one parameter of an ion implant process to be performed on a process layer to be subjected to said etch recipe in said etch tool; and
  performing said ion implant process comprised of said determined at least one parameter on said process layer.

10. The method of claim 9, further comprising performing said etch recipe on said process layer after said ion implant process has been performed.

11. The method of claim 9, further comprising performing said ion implant process comprised of said determined parameter on process layers formed above subsequently processed substrates prior to performing said etch recipe in said etch tool on said process layers.

12. The method of claim 9, wherein said determined at least one parameter of said ion implant process is determined to compensate for said across-substrate variations in etch rate.

13. A method, comprising:
  determining, for a specified etch tool and a specified etch recipe, across-substrate variations in etch rate when performing said etch recipe in said etch tool;

determining, based upon said determined across-substrate variations in etch rate, at least one parameter of an ion implant process that produces across-substrate variations in implant regions formed by performing said implant process; and performing said ion implant process on at least one process layer to be subjected to said etch recipe in said etch tool.

14. The method of claim 13, further comprising performing said ion implant process on additional process layers that are to be subjected to said etch recipe in said etch tool.

15. The method of claim 13, wherein said etch rate is determined based upon measurements made after performing said etch recipe has been completed.

16. The method of claim 13, further comprising establishing a relationship between said at least one implantation parameter and an etch rate for said at least one process layer and said specified etch recipe.

17. The method of claim 16, wherein an implantation dose is varied so as to substantially compensate for said substrate-across etch rate non-uniformities on the basis of said relationship.

18. The method of claim 13, wherein an implantation energy is selected so that a peak concentration of implanted ions is within a thickness of said at least one process layer.

19. The method of claim 13, wherein said ions are selected so as to have a diffusivity that is less than a predefined threshold at temperatures of subsequent manufacturing processes.

20. A method comprising:
determining, for a specified etch tool and a specified etch recipe, a local etch rate at a plurality of locations across a first substrate subjected to an etch process to remove portions of a layer of specified material formed on said first substrate; and implanting ions into a layer of specified material formed on a subsequently processed substrate prior to subjecting said subsequently processed substrate to an etch process with said specified etch recipe in said specified etch tool, wherein one or more implantation parameters are adjusted based on said local etch rate obtained from said first substrate.

21. The method of claim 20, further comprising establishing a relationship between said one or more implantation parameters and an etch rate for said specified material layer and said specified etch recipe.

22. The method of claim 21, wherein an implantation dose is varied so as to substantially compensate for local etch rate non-uniformities on the basis of said relationship.

23. The method of claim 20, wherein an implantation energy is selected so that a peak concentration of implanted ions is within a thickness of said specified material layer.

24. The method of claim 20, wherein said ions are selected so as to have a diffusivity that is less than a predefined threshold at temperatures of subsequent manufacturing processes.

25. The method of claim 20, wherein said local etch rate is determined for a plurality of first substrates to obtain an averaged local etch rate.

26. The method of claim 20, wherein said local etch rate is determined based upon measurements made as said etching process is being performed.

27. The method of claim 20, wherein said local etch rate is determined based upon measurements made after said etching process has been completed.

28. A method comprising:
forming a first layer of a specified material on a first substrate;

etching said first layer using a specified etch tool and a specified etch recipe;

determining a local etch rate at a plurality of predefined locations of the first substrate;

forming a second layer of said specified material on at least one of a second substrate and said first substrate;

implanting a specified ion species according to specified implantation parameters into said second layer;

etching said second layer using said specified etch tool and said specified etch recipe; and determining a difference between the local etch rate in etching the first layer and a second etch rate in etching the second layer at a plurality of predefined locations on the first and second substrates.

29. The method of claim 28, further comprising forming a plurality of second layers and changing at least one implantation parameter value when implanting said specified ion species in each of the plurality of second layers to determine a plurality of etch rate differences.

30. The method of claim 29, further comprising selecting suitable values of said at least one implantation parameter for each predefined location so that an expected difference of the etch rate at said plurality of predefined locations is within a predefined range when said specified ion species are implanted into said second layer according to said selected suitable values.

31. The method of claim 30, further comprising etching at least one of said second layers, determining said local etch rates and fine-tuning said selected parameter values on the basis of said local etch rates.

* * * * *